United States Patent

Nam et al.

[11] Patent Number: 5,859,763
[45] Date of Patent: Jan. 12, 1999

[54] MULTI CHIP MODULE COOLING APPARATUS

[75] Inventors: Sang Sig Nam, Taejon; Ho Young Kwak; Jae Hee Kim, both of Seoul, all of Rep. of Korea

[73] Assignee: Electronics and Telecommunications Research Institute, Taejon, Rep. of Korea

[21] Appl. No.: 773,493

[22] Filed: Dec. 23, 1996

[30] Foreign Application Priority Data

Dec. 23, 1995 [KR] Rep. of Korea .................. 1995 55865

[51] Int. Cl.[6] ..................................................... H05K 7/20
[52] U.S. Cl. .................... 361/699; 62/259.2; 165/104.33
[58] Field of Search .................. 62/259.2, 376,
62/435; 257/714, 715; 165/80.3, 80.4, 185,
104.21, 104.22, 104.33, 104.34; 361/689,
698, 699, 700, 701, 704, 707, 715, 716,
717, 718, 722

[56] References Cited

U.S. PATENT DOCUMENTS

| 3,774,677 | 11/1973 | Antonetti | 165/39 |
|---|---|---|---|
| 3,993,123 | 11/1976 | Chu | 165/80 |
| 4,602,679 | 7/1986 | Edelstein | 165/104.26 |
| 5,161,089 | 11/1992 | Chu et al. . | |
| 5,329,993 | 7/1994 | Ettehadieh | 165/104.14 |
| 5,349,831 | 9/1994 | Daikoku | 62/376 |
| 5,394,936 | 3/1995 | Budelman | 165/104.33 |
| 5,406,807 | 4/1995 | Ashiwake | 62/376 |

Primary Examiner—Gerald Tolin
Attorney, Agent, or Firm—Jacobson, Price, Holman & Stern, PLLC

[57] ABSTRACT

The multi chip module cooling apparatus of the present invention includes a cold plate having a sealed housing formed with a first side member, a second side member and an interior space, and a metal block having a refrigerant vapor flow passage and a cooling water flow passage formed in opposite to the refrigerant vapor flow passage so as to condense the refrigerant vapor discharged from the housing by using a cooling water flowed in the cooling water passage. A pair of circulating tubes connect the cold plate and the block as a circulation loop shape, the circulating tubes are consisted of a refrigerant vapor flow tube for discharging a hot refrigerant vapor from the housing of the cold plate to the refrigerant vapor flow passage in the blocks and a refrigerant flow tube for supplying a refrigerant condensed in the block to the housing of the cold plate. Thermosyphon action due to boiling of the refrigerant in the vertical channel of the cold plate eliminate the significant temperature rise at the multi chip module, which occurs in the horizontal channel in the cold plate.

4 Claims, 6 Drawing Sheets

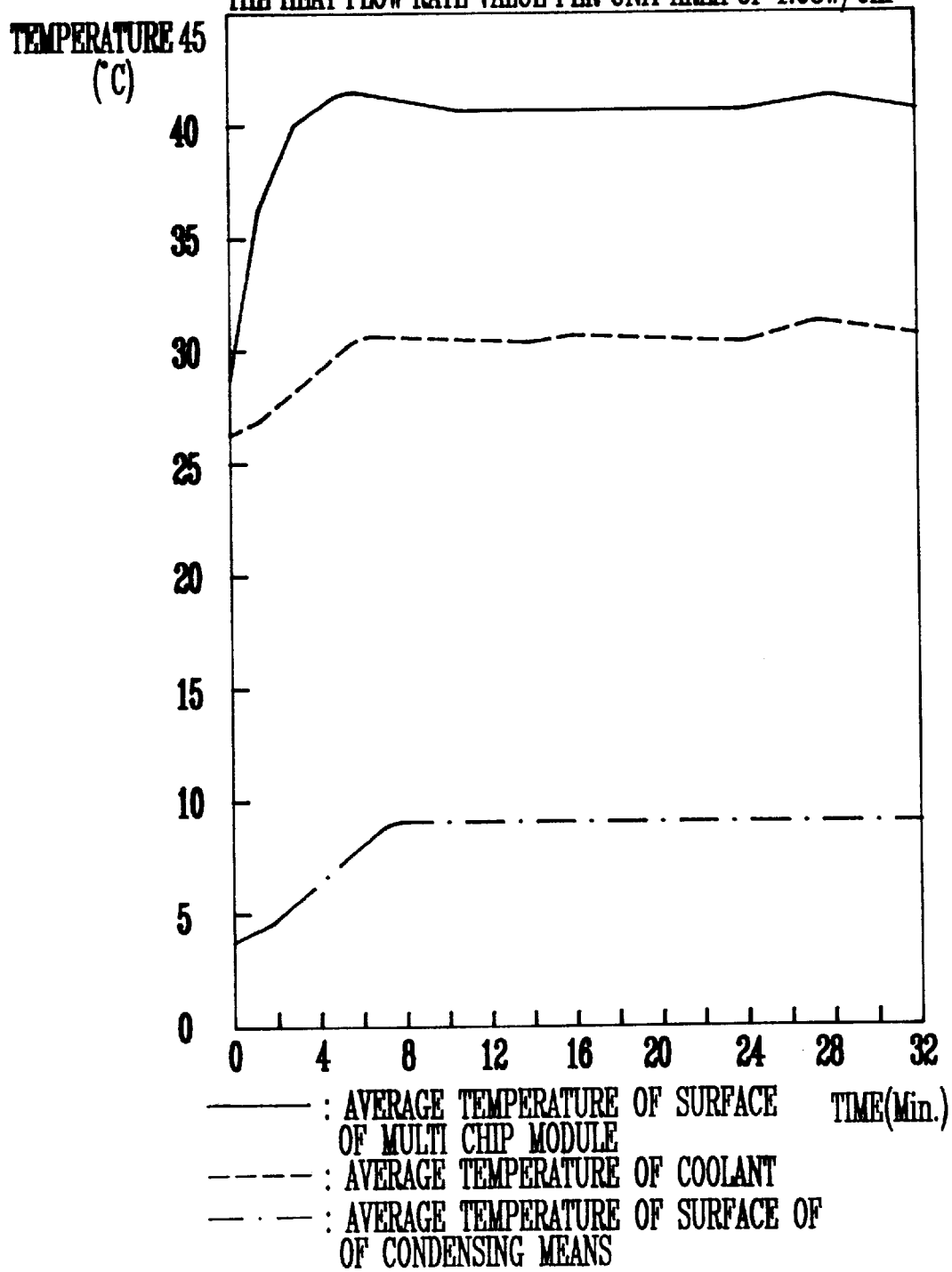

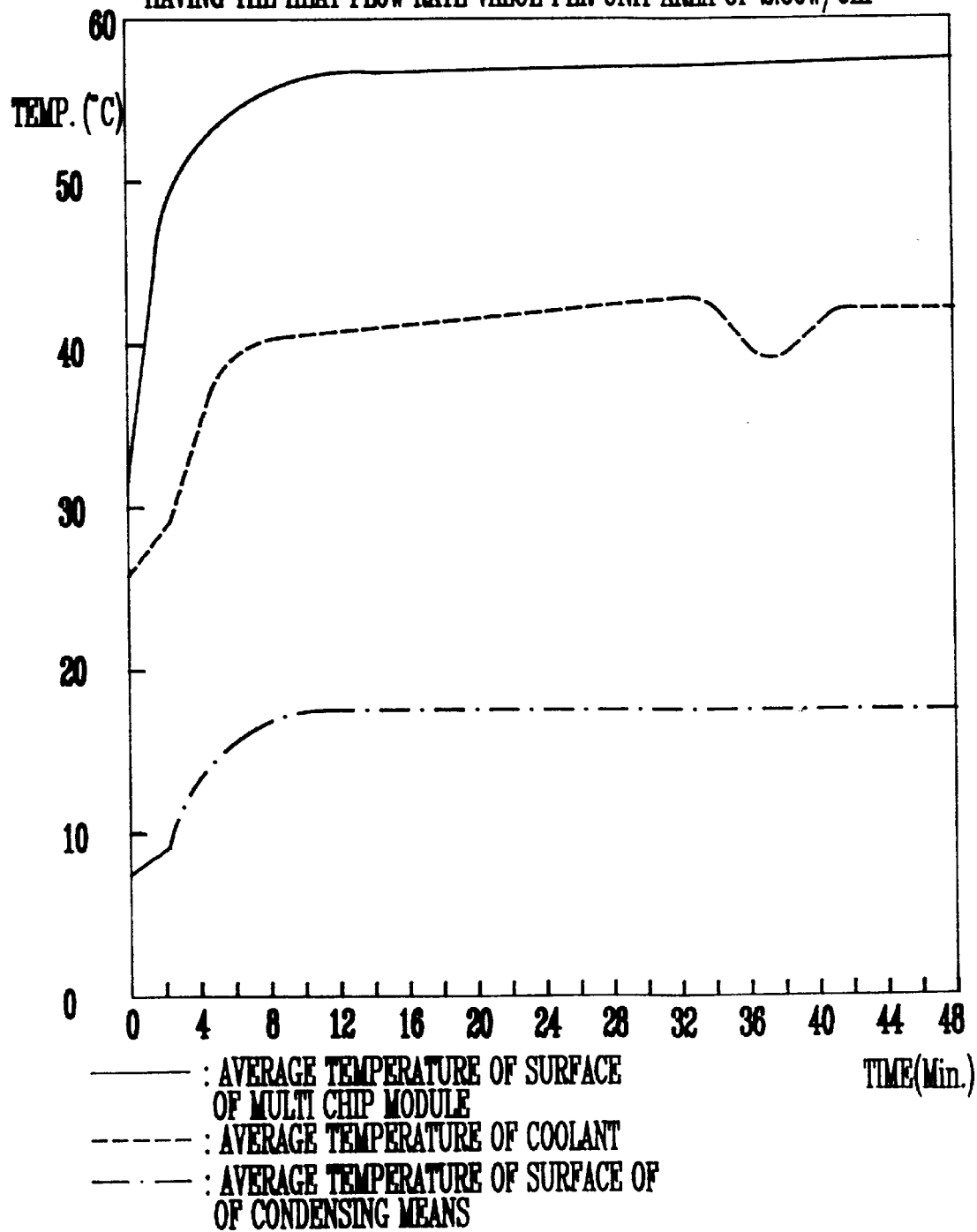

MULTI CHIP MODULE COOLING APPARATUS

BACKGROUND OF THE INVENTION

1. Field of the Invention

The present invention relates to a multi chip module cooling apparatus and, more particularly, to a multi chip module cooling apparatus which can maximize cooling efficiency of a multi chip module and which is composed of simple constitution.

2. Description of the Prior Art

It is well known that construction of a high speed broadband asynchronous transfer mode (hereinafter referred to as "ATM") exchange network is economical for realization of a broadband integrated service digital network, and development of an ATM switching system is in progress. The ATM switching system is in the trend of high speed, large capacity, and miniaturization and high density of system according to the progress of semiconductor technology, material and parts technology and system packaging technology, and especially, the system packaging technology related to interconnection technology and cooling technology serves as the most important factor of deciding the performance of the system according to the increase of transmission speed of system to several hundreds Mbps (mega bit per second) to several tens Gbps (giga bit per second) due to the development of high speed device technology using a large scale integration (LSI) chip and a very large scale integration (VLSI) chip.

In a narrowband integrated service digital network using COB (card on board) method in which a card is mounted on a board, the heat flow rate value per unit area of chip module is no more than 0.01 to 0.1 $W/cm^2$, therefore, a natural convection cooling method or low flow rate forced convection cooling method using air is used in cooling of system. However, the broadband integrated service digital network to realize picture transmission has information processing rate of several hundreds Gbps and uses a multi chip module other than a single chip module used in the narrowband integrated service digital network. The multi chip module can minimize signal propagation delay between chips due to high degree of circuit and can reduce dispersion of electromagnetic wave, thereby improving the performance of switching system. However, in case of using the multi chip module, the heat flow rate value per unit area is expected to be about 2 $W/cm^2$.

That is, a plurality of LSI and VLSI chips are mounted in the multi chip module used to promote the high density, high integration and high speed of system, therefore, a lot of heat is produced in each chip at the time of operation of system. If the chips, which generate a lot of heat, are left in the system, the inside of the system becomes high temperature condition so as to be a cause of failure of parts. Also, such increase of generated heat increases the temperature of the inside of the system so as to delay the signal transmission time between the parts in the system, and incorrectly transmit the signal. Therefore, the reliability of the system is abruptly deteriorated, so that cooling apparatus different from conventional one is required.

Especially, since the heat flow rate value per unit area in the multi chip module used in global integrated services digital network which will use three dimensional mounting technology is expected to be more than 10 $W/cm^2$, a cooling apparatus of high efficiency is needed.

SUMMARY OF THE INVENTION

The object of the present invention is to provide a cooling apparatus having excellent cooling efficiency for efficiently cooling a lot of heat generated at the time of operation of the multi chip module.

The present invention to implement the above described object comprises a cold plate for cooling a multi chip module mounted thereon by means of a refrigerant contained therein; a condensing means connected to the cold plate and condensing a hot refrigerant vapor vaporized in the cold plate and flowed therein by means of a cooling water flowed therein; a pair of circulating tubes connecting the cold plate and the condensing means as a circulation loop shape. The circulating tubes are divided into a refrigerant vapor flow tube supplying a hot coolant vapor discharged from the cold plate to the condensing means and a refrigerant flow tube supplying a refrigerant condensed cooled at the condensing means to the cold plate by means of gravity.

The cold plate in the present invention comprises a sealed housing having an interior space, a mounting means for mounting said multi chip module, a refrigerant vapor outlet at the upper end, a refrigerant inlet at lower end and a vertical baffle movably mounted in the interior space and dividing the interior space into two spaces. The refrigerant vapor outlet is connected to the coolant vapor flow means of the condensing means, and the refrigerant inlet is connected to the refrigerant vapor flow means of the condensing means through the refrigerant vapor flow tube and the coolant flow tube, respectively. Refrigerant contained in the space of the housing is vaporized and discharged through the refrigerant vapor outlet by means of forced thermosyphon action due to boiling in the vertical channel adjusted by the baffle. The refrigerant vapor is then flowed in the condensing means to condense. The refrigerant condensed in the condensing means is reentered in the housing for cooling the multi chip module.

The condensing means comprises a metal block of excellent thermal conductivity, a refrigerant vapor flow means formed in one side in the block and connected to the cold plate through the of circulating tubes, a cooling water flow means formed in opposite to the refrigerant vapor flow means in the block so as to be adjacent the refrigerant vapor flow means to condense the coolant vapor flowed in the refrigerant vapor flow means.

BRIEF DESCRIPTION OF THE DRAWINGS

For fuller understanding of the nature and objects of the present invention, reference should be had to the following detailed description taken in conjunction with the accompanying drawings in which:

FIG. 6 is a graph showing an average temperature of multi chip module, cold plate and condensing means at the time of cooling the multi chip module having the heat flow rate value per unit area of 1.08 $W/cm^2$ by utilizing the present invention; and FIG. 7 is a graph showing an average temperature of multi chip module, cold plate and condensing means at the time of cooling the multi chip module having the heat flow rate value per unit area of 2.66 W/cm² by utilizing the present invention.

DETAILED DESCRIPTION OF THE INVENTION

Now, the present invention will be described in detail with reference to the accompanying drawings.

Figure 1:
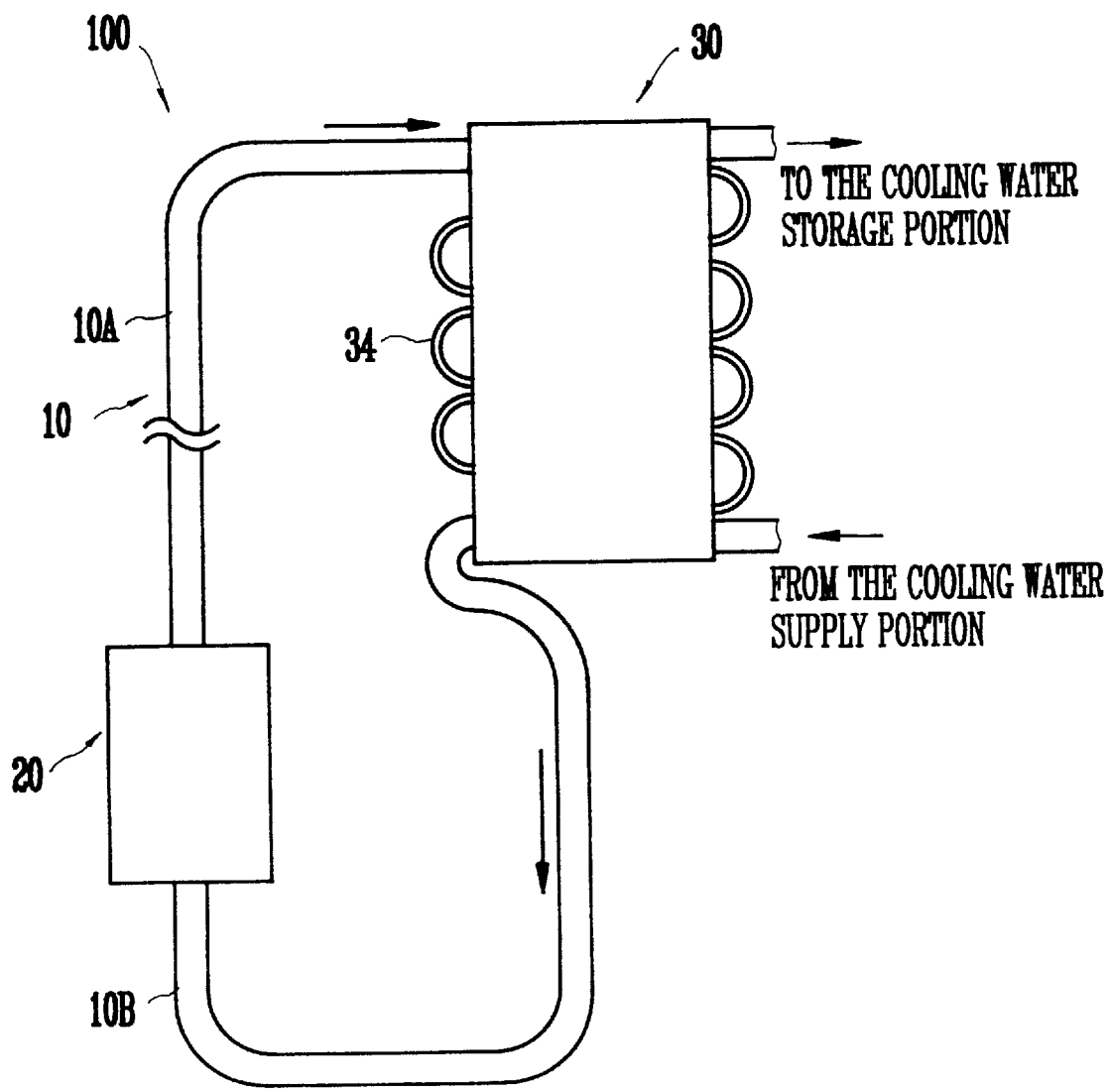
FIG. 1 is a schematic drawing showing an entire structure of multi chip module cooling apparatus according to the present invention.

FIG. 1 is a schematic drawing showing the entire structure of multi chip module cooling apparatus according to the present invention. A cooling apparatus 100 comprises a refrigerant circulation tube 10 which is a flow passage for a coolant and refrigerant vapor, a cold plate 20 for cooling a multi chip module (not shown) by utilizing the refrigerant contained therein, and a condensing means 30, which is connected to the cold plate 20 by the circulation tube 10 and condenses the refrigerant vapor flowed from the cold plate 20 and absorbs a latent heat of the refrigerant vapor. As shown in FIG. 1, the refrigerant circulation tube 10 is a loop type and is a cooling module having a thermo-siphon natural circulation passage by connecting the cold plate 20 and the condensing means 30. Also, the refrigerant circulation tube 10 is divided into a coolant vapor flow tube 10A and a condensed refrigerant flow tube 10B.

Now, construction of each means will be described.

Figure 2:
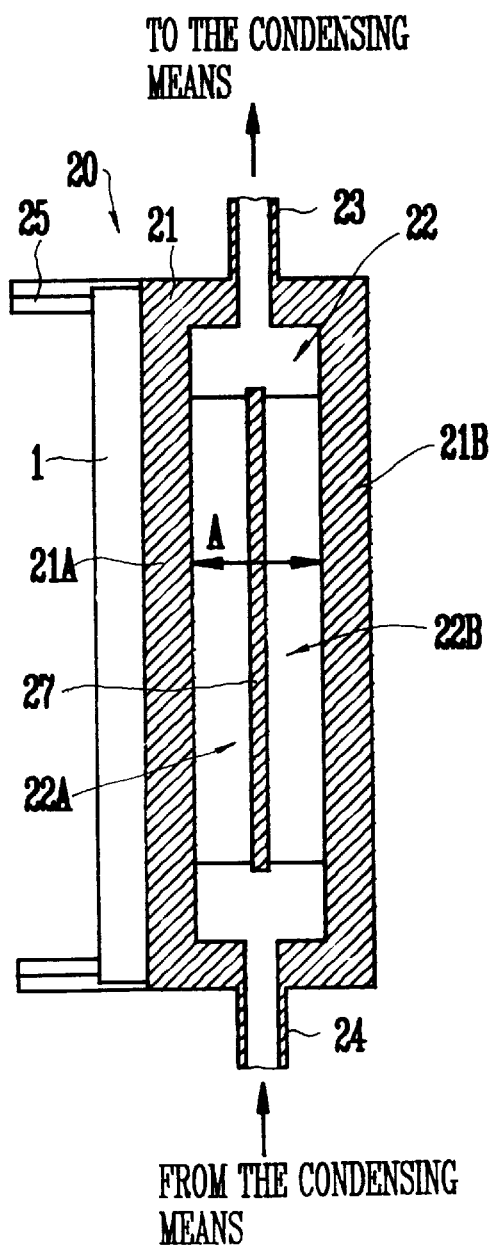
FIG. 2 is a side sectional view of a cold plate shown in FIG. 1.
Figure 3:
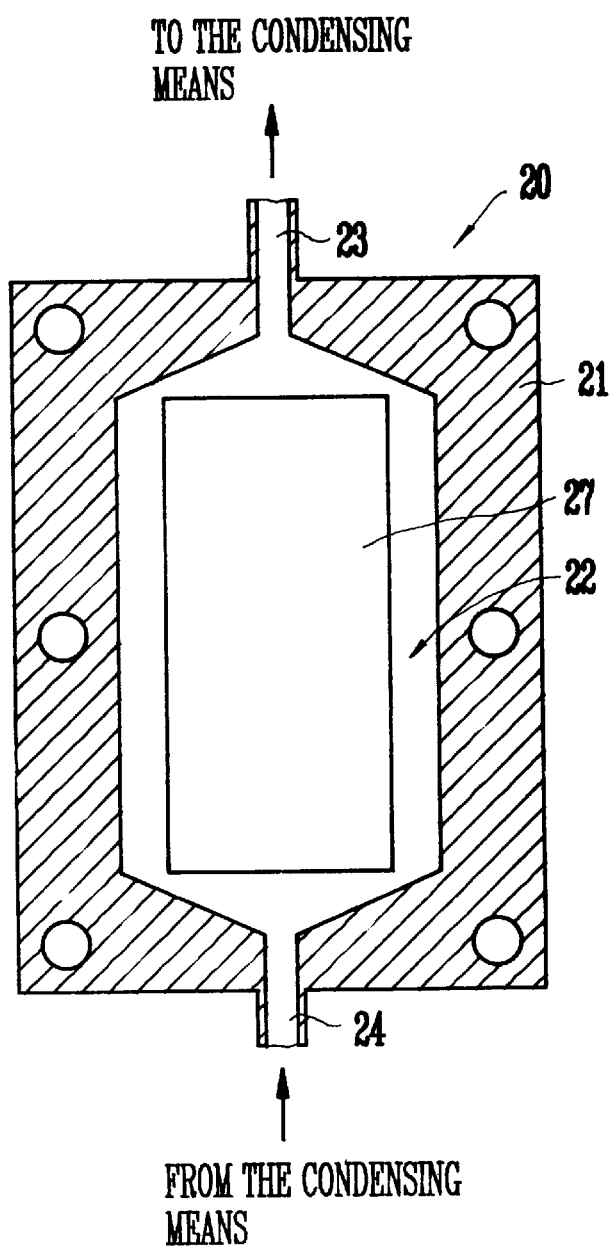
FIG. 3 is a front sectional view of the cold plate shown in FIG. 1.

FIG. 2 is a side sectional view of the cold plate 20 shown in FIG. 1 and FIG. 3 is a front sectional view of the cold plate 20. The cold plate 20 comprises a housing 21 and a baffle 27 mounted in the housing 21.

The housing 21 is a sealed member in which an interior space 22 is formed. The housing 21 has a first side member 21A and second side member 21B. At the upper end and lower end of the housing 21 are formed a refrigerant vapor outlet 23 connected to the refrigerant vapor flow tube 10A and a coolant inlet 24 connected to the refrigerant flow tube 10B shown in FIG. 1, respectively. A mounting means 25 for mounting a multi module chip 1 is installed on the first side member 21A of the housing 21. As shown in FIG. 2, one side of the multi chip module 1 mounted on the housing 21 by the mounting means 25 contacts with the outer surface of the first side member 21A of the housing 21.

The baffle 27 vertically mounted in the interior space 22 in the housing 21 is a plate type having a constant area and divides the interior space 22 of the housing 21 into a first and second spaces 22A and 22B as shown in FIG. 2. Upper end and lower portions the of the baffle 27 correspond to the above described refrigerant vapor outlet 23 and coolant inlet 24, respectively. On the other hand, although not shown in the drawing, the baffle 27 can be moved horizontally, denoted by an arrow A in FIG. 2, by a moving means, therefore, a width of the first space 22A, where the boiling and the forced convection phenomenon of the refrigerant occur, can be adjusted according to movement of the baffle 27.

The heat generated at the multi chip module 1 is transmitted to the refrigerant existing in the first space 22A through the first side member 21A of the housing 21, which faces the multi chip module 1. The refrigerant which absorbs the heat is vaporized, therefore, a refrigerant vapor rises to the upper side of the first space 22A by the forced convection phenomenon due to pumping of refrigerant vapor bubble. The baffle 27 moving to the right and left pumps the hot refrigerant vapor so that a refrigerant vapor vaporized from the coolant by the heat is discharged to the outside of the housing 21 through the refrigerant vapor outlet 23. At the same time, the coolant existing in the second space 22B of the housing 21 flows into the first space 22A. In addition, the refrigerant of low temperature which passed through the condensing means 30 which will be described later flows into the interior space 22 of the housing 21 through the coolant inlet end 24.

Meanwhile, the refrigerant in the second space 22B formed between the baffle 27 and the second side member 21B of the housing 21 is supplied to the first space 22A and adjusts the refrigerant necessary for the first space 22A so that the dry-out phenomenon does not occur even in an excessive thermal load.

Figure 4:
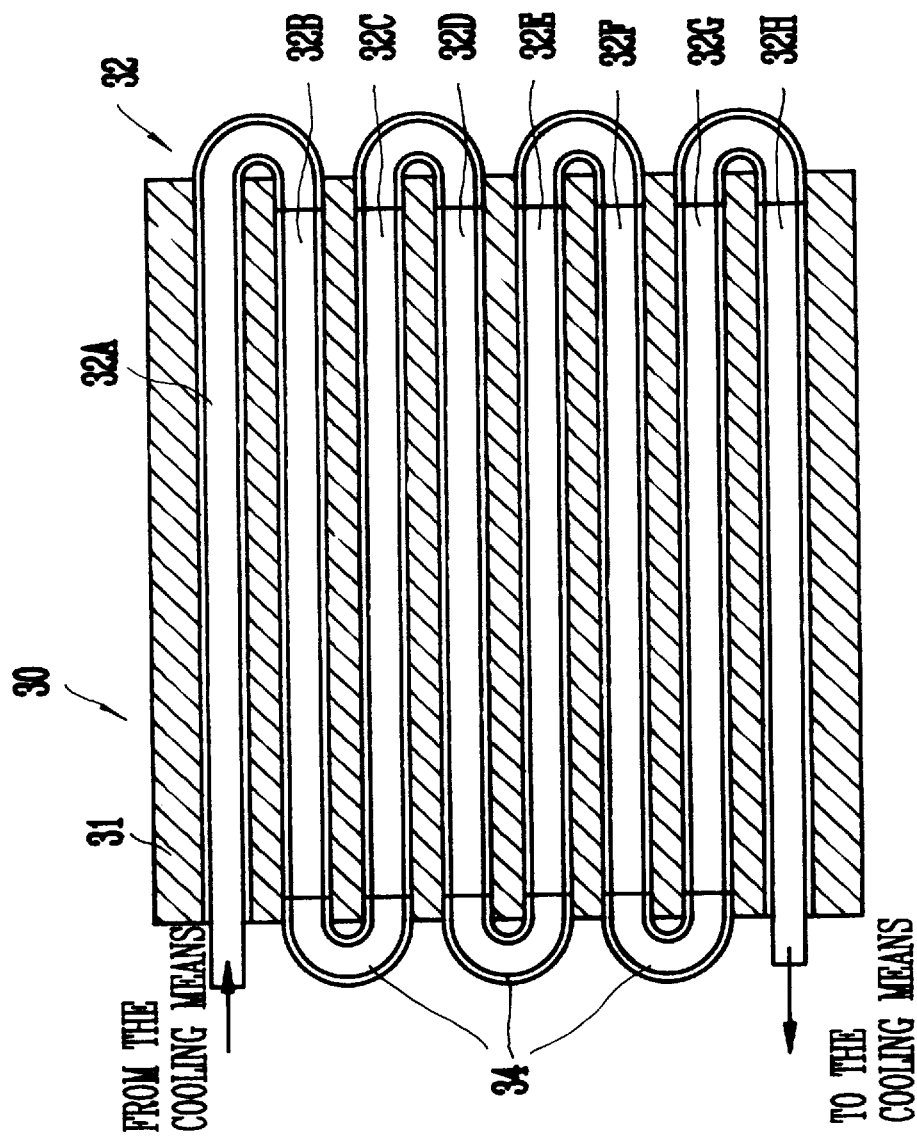
FIG. 4 is a side sectional view of a condensing means shown in FIG. 1.
Figure 5:
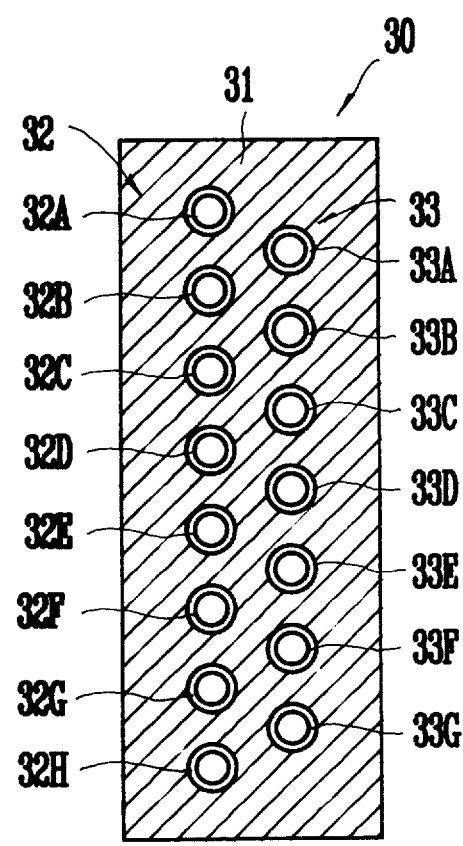
FIG. 5 is a front sectional view of the condensing means shown in FIG. 1.

FIGS. 4 and 5 are side and front sectional views of the condensing means 30 shown in FIG. 1. The internal construction and function of the condensing means 30 will be described with reference to FIGS. 1 and 4, 5. The condensing means 30 comprises a single block 31 composed of a metal material, a refrigerant vapor flow means 32 and cooling water flow means 33.

At one side in the metal block 31 of excellent thermal conductivity is installed the refrigerant vapor flow means 32 composed of a plurality of horizontal refrigerant vapor flow passages 32A, 32B, . . . 32H. The refrigerant vapor passages 32A, 32B, . . . 32H are arranged in one vertical plane through all the height of the block 31, one end of the refrigerant vapor flow passage 32A positioned at the upper end is connected to the refrigerant vapor flow tube 10A connected to the refrigerant vapor outlet 23 of the cold plate 20. In addition, one end of the refrigerant vapor flow passage 32H positioned at the lower end is connected to the refrigerant flow tube 10B connected to the refrigerant inlet 24 of the cold plate 20. Meanwhile, an end of the each refrigerant vapor flow passage excluding the end of the upper refrigerant flow passage 32A and the end of lower refrigerant flow passage 32H, which are connected to the refrigerant vapor outlet 23 and refrigerant inlet 24 of the cold plate 20, respectively, is connected to an end of the another refrigerant vapor flow passage positioned below thereof by the connecting tubes 34. Therefore, the refrigerant vapor flow passages 32A, 32B, . . . 32H together with the connecting tubes 34 form a single refrigerant vapor flow passage, and as a result, the cold plate 20 and the condensing means 30 have a natural circulation loop shape through the coolant vapor flow tube 10A and the refrigerant flow tube 10B.

On the other hand, at other side in the metal block 31 is installed the cooling water flow means 33 composed of a plurality of horizontal cooling water flow passages 33A, 33B, . . . 33G. The cooling water flow passage 33A, 33B, . . . 33G are arranged in one vertical plane through all the height of the block 31. One end of the cooling water flow passage 33A positioned at the upper end is connected a cooling water storage portion (not shown), and one end of the cooling water flow passage 33G positioned at the lower end is connected a cooling water supply portion (not shown).

Meanwhile, an end of the each cooling water flow passage excluding the end of the upper cooling water flow passage 33A and the end of lower cooling water flow passage 33G, which are connected to the cooling water storage portion and cooling water supply portion, respectively, is connected to an end of the another cooling water flow passage positioned below thereof by the connecting tube (not shown), in the same way as that of the refrigerant flow passages. Therefore, the cooling water flow passages 33A, 33B, . . . 33G form a single cooling water flow passage through the connecting tubes.

As shown in FIG. 5, the refrigerant vapor flow passages 32A, 32B, . . . 32H and the cooling water flow passages 33A, 33B, . . . 33G formed in the block 31 are constituted adjacent to each other so as to satisfactorily perform the heat exchange between the refrigerant vapor flowed in the refrigerant vapor flow passages 32A, 32B, . . . 32H and the cooling water flowed in the cooling water passages 33A, 33B, . . . 33G. That is, the hot refrigerant vapor discharged from the cooling means 20 (the condition where the cooling to the multi chip module was performed as described above) flows along the refrigerant vapor flow passages 32A, 32B, . . . 32H of the condensing means 30, thus, the sensible heat and latent heat of the refrigerant vapor are transmitted to the cooling water which flows in the cooling water flow passages 33A, 33B, . . . 33G.

The refrigerant which is condensed and below certain temperature reenters the cold plate 20 through the coolant flow tube 10B connecting the condensing means 30 and cold plate 20 so as to perform the cooling function of the multi chip module 1. On the other hand, the cooling water whose temperature becomes high due to the latent heat is discharged to the cooling storage portion through the cooling water flow passages 33A, 33B, . . . 33G, and at the same time, new cooling water of low temperature enters the cooling water flow passage 33A, 33B, . . . 33G so as to repeat the above described refrigerant condensing procedure.

The present invention can improve the cooling efficiency of the multi chip module by inducing the forced convection, boiling and circulation phenomenon of the refrigerant, which performed the cooling function, by forming the cold plate 20, condensing means 30 and the refrigerant circulation tube 10 as a circulation loop shape. In addition, the present invention can maximize the cooling efficiency of the refrigerant and, as a result, can improve the cooling efficiency to the multi chip module by continuously supplying refrigerant vapor into the condensing means 30 by the thermo-syphon action and returning by gravity to the cold plate 20.

The performance of the present invention having such construction and function as described above is a follows.

FIG. 6 is a graph showing the average temperature of surface of the multi chip module, refrigerant and the surface of the condensing means at the time of cooling the multi chip module having the heat flow rate value per unit area of 1.08 W/cm$^2$ utilizing the present invention. From this graph, it can be seen that the multi chip module is kept in a stable temperature after about 10 minutes from starting the operation of the multi chip module and also that the condensing means and refrigerant performs the cooling function to the multi chip module without significant temperature change.

FIG. 7 is a graph showing the average temperature of surface of the multi chip module, refrigerant and surface of the condensing means at the time of cooling the multi chip module having the heat flow rate value per unit area of 2.66 W/cm$^2$ utilizing the present invention. From this graph, it can be seen that the multi chip module having a relatively large caloric value per unit area also maintains the temperature of about 56° C. after about 24 minutes from starting the operation, and that the multi chip module is efficiently cooled without significant change in thermal characteristics.

In the present invention as described above, the cooling means and condensing means have simple structure and the members constituting the condensing means are integrated so as to compose a small cooling apparatus with low cost, and the surface temperature of the multi chip module can be kept to a constant temperature. Also, the cooling can be normally performed in short period even when the thermal load is changed, so that the stability of the system can be improved.

Many modifications and variations may be made in the techniques and structures described and illustrated herein without departing from the spirit and scope of the present invention. Accordingly, it should be understood that the techniques and structures described and illustrated herein are illustrative only and are not to be considered as limitations upon the scope and spirit of the present invention.

What is claimed is:

1. A multi chip module cooling apparatus comprising:
   a cold plate cooling a multi chip module mounted thereon by means of a refrigerant contained therein, said cold plate including a sealed housing in which a refrigerant vapor outlet and a refrigerant inlet are formed at upper and lower ends, respectively, and a vertical baffle movably mounted in said housing and dividing said interior space of said housing;
   a condensing means for condensing a hot refrigerant vapor vaporized in said cold plate by means of a cooling water flowed therein, said condensing means formed of a metal block in which a refrigerant vapor flow means is formed in one side and a cooling water flow means is formed in opposite to said refrigerant vapor flow means; and
   a pair of circulating tubes connecting said cold plate and said condensing means as a circulation loop shape, said circulating tubes including a refrigerant vapor flow tube connecting said refrigerant vapor outlet of said cold plate with said refrigerant vapor flow means of said block for supplying a hot refrigerant vapor discharged through said refrigerant vapor outlet to said condensing means, and a refrigerant flow tube connecting said refrigerant vapor flow means of said block with said refrigerant inlet of said cold block for supplying a refrigerant condensed and cooled at said condensing means to said cold plate by means of gravity; wherein, a thermosyphonic action occurs in said interior space defined by said baffle within said sealed housing of said cold plate when said refrigerant absorbs heat from said multi chip module, by which said refrigerant is vaporized and flows into said refrigerant vapor flow means of said block through said refrigerant vapor flow tube.

2. The apparatus of claim 1, wherein said housing has a first and second side members, an interior space and a mounting means for mounting said multi chip module at said first side member, said interior space being divided into a first space and a second space by said baffle, wherein said refrigerant contained in said first space between said baffle and said first side member which faces with said multi chip module is vaporized and discharged through said refrigerant vapor outlet by means of said thermosyphonic action inside the vertical channel adjusted by said baffle, and said refrigerant contained said second space between said baffle and said second side member is supplied to said first space so that the dry-out phenomenon does not occur even in an excessive thermal load.

3. The apparatus of claim 1, wherein said refrigerant vapor flow means is a plurality of refrigerant vapor flow passages installed in one vertical plane through all the height of said block, wherein one end of one of said refrigerant vapor flow passages is connected to one end of adjacent refrigerant vapor flow passage through a connecting tube to form a single refrigerant flow passage, one end of refrigerant vapor flow passage positioned at the upper end is connected to said refrigerant vapor outlet of said cold plate and one end of refrigerant vapor flow passage positioned at the lower end is connected to said refrigerant inlet of said cold plate thereby connecting said cold plate and condensing means to each other to form a natural circulation loop.

4. The apparatus of claim 1, wherein said cooling water flow means is a plurality of cooling water flow passages installed in one vertical plane through all the height of said block, wherein one end of one of said cooling water flow passage is connected to one end of adjacent cooling water flow passage through a connecting tube to form a single cooling water flow passage, and one end of cooling water flow passage positioned at the upper end is connected to a cooling water storage portion, and one end of cooling water flow passage positioned at the lower end is connected to a cooling water supply portion.

* * * * *